United States Patent [19]

Homma et al.

[11] Patent Number: 5,177,498
[45] Date of Patent: Jan. 5, 1993

[54] HEAT-RESISTANT INSULATING SUBSTRATE, THERMAL PRINTING HEAD, AND THERMOGRAPHIC APPARATUS

[75] Inventors: Katsuhisa Homma, Kawasaki; Masaru Nikaido, Miura; Yoshiaki Ouchi; Mutsuki Yamazaki, both of Yokohama; Shuji Yoshizawa, Tokyo, all of Japan

[73] Assignee: Kabushiki Kaisha Toshiba, Kanagawa, Japan

[21] Appl. No.: 804,014

[22] Filed: Dec. 9, 1991

Related U.S. Application Data

[60] Continuation of Ser. No. 519,179, May 4, 1990, Pat. No. 5,119,112, which is a division of Ser. No. 328,980, Mar. 27, 1989, Pat. No. 4,963,893.

[30] Foreign Application Priority Data

Mar. 28, 1988 [JP] Japan ................................. 63-74241
Sep. 13, 1988 [JP] Japan ................................. 63-227524

[51] Int. Cl.⁵ ............................................. B41J 2/335
[52] U.S. Cl. ............................................... 346/76 PH
[58] Field of Search ................................ 346/76 PH

[56] References Cited

U.S. PATENT DOCUMENTS 4,868,584 9/1989 Nikaido et al. ............... 346/76 PH

FOREIGN PATENT DOCUMENTS 0118273 7/1983 Japan ............................ 346/76 PH
61-297159 12/1986 Japan.
62-117760 5/1987 Japan.
62-21428 8/1988 Japan.
62-134326 12/1988 Japan.
62-191655 2/1989 Japan.

OTHER PUBLICATIONS

English translation of claim 1 of each of Japanese patent application Nos. 62-21428, 62-134326, and 62-6-2-191655 Copending application Ser. No. 07/400,086 filed Aug. 29, 1989.

Adams et al., "Characterization of Plasma-Deposited Silicon Dioxide", Journal of the Electrochemical Society, vol. 128, No. 7, Jul. 1981, pp. 1545-1551.

*Primary Examiner*—Benjamin R. Fuller
*Assistant Examiner*—Huan Tran
*Attorney, Agent, or Firm*—Finnegan, Henderson, Farabow, Garrett and Dunner

[57] ABSTRACT

A layer of an amorphous substance containing at least one member from among hydrogen and halogen elements and using as main components thereof silicon and at least one member selected from among nitrogen, carbon, and oxygen is formed as a resin-protecting layer or an abrasion-resistant layer in a thermal printing head or as a resin-protecting layer in a heat-resistant insulating substrate. The hardness of the substrate itself is greatly improved by this layer of the amorphous substance. As the result, the substrate as a whole or the thermal printing head as a whole acquires high rigidity and improved resistance to crack.

6 Claims, 3 Drawing Sheets

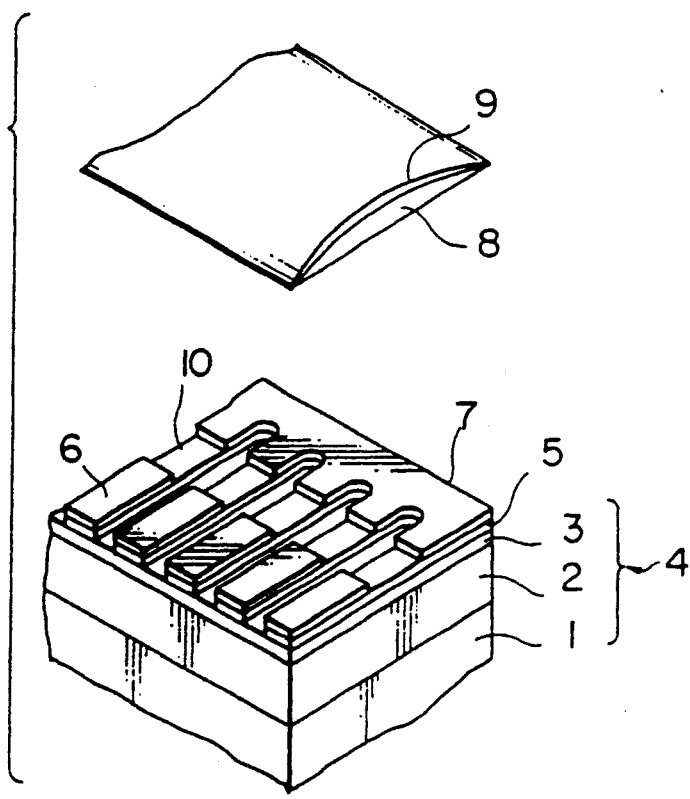

(a) PRETREATMENT OF THE METALLIC SUBSTRATE (b) FORMATION OF THE HEAT-RESISTANT RESIN LAYER (c) WASHING OF THE SURFACE OF THE HEAT-RESISTANT RESIN LAYER (d) FORMATION OF THE RESIN-PROTECTING LAYER BY THE PLASMA CVD METHOD (e) FORMATION OF THE FILM OF THE HEAT-GENERATING RESISTOR SUBSTANCE (f) FORMATION OF THE FILM OF THE ELECTRODE SUBSTANCE (g) FORMATION OF THE CIRCUIT PATTERN (h) FORMATION OF THE ABRASION-RESISTANT LAYER

HEAT-RESISTANT INSULATING SUBSTRATE, THERMAL PRINTING HEAD, AND THERMOGRAPHIC APPARATUS

This is a continuation of application Ser. No. 07/519,179, filed May 4, 1990, now U.S. Pat. No. 5,119,112 which is a division of application Ser. No. 07/328,980 filed Mar. 27, 1989 now U.S. Pat. No. 4,963,893.

FIELD OF THE INVENTION AND RELATES ART STATEMENT

This invention relates to a thermographic apparatus such as facsimile or printer, a thermal printing head to be used therein, and a heat-resistant insulating substrate to be used in the thermal printing head and various electronic devices.

In recent years, heat-resistant insulating substrates having insulating layers or heat-accumulating layers of such heat-resistant resin as a polyimide resin on substrates of a varying kind have been finding growing utility as high-resistance base plates for thermal printing heads and as supporting base plates for various electronic devices such as hybrid IC grade multilayer circuit boards which are required to exhibit performance of high reliability in spite of effects of heat.

In thermal printing heads, for example, the conventional high-resistance base plates produced by forming a glazed glass layer as an insulating layer capable of controlling radiation and accumulation of heat on a substrate of such a ceramic substance as alumina are giving place to heat-resistant resin layer such as a polyimide resin layer on ceramic substrates or metallic substrates.

One thermal printing head provided with this polyimide resin layer as an insulating layer is known to possess the following construction, for example.

The thermal printing head is produced by superposing a heat-resistant resin layer formed of a polyimide resin, for example, and intended to serve concurrently as a heat-accumulating layer and a heat-resistant layer on a metallic substrate made of a Fe alloy, for example, covering the heat-resistant resin layer with a heat-generating resistor film such as of $Ta-SiO_2$ or $Ti-SiO_2$ by the spattering technique, further depositing on the heat-generating resistor film such several electrodes and common electrodes made of Al or Al-Si-Cu, for example, and adapted to give rise to openings destined to serve as heat-generating parts, and forming an abrasion-resistant layer of silicon oxynitride (Si-O-N), for example, in such a manner as to cover at least the heat-generating parts and serve concurrently as an antioxidant film (hereinafter referred to as "abrasion-resistant layer," the term "abrasion-resistant layer" as used in the present specification and the appended claims shall be construed as an abrasion-resistant layer concurrently serving as an antioxidant layer).

The thermal printing head of this construction, owing to the use of the insulating layer of polyimide resin which possesses a heat diffusion ratio as low as one third to one sixth of that of the conventional glazed glass layer, is pre-eminently excellent in thermal efficiency. Further, since this thermal printing head is allowed to use the metallic substrate, namely a supporting substrate possessing flexibility, it can tolerate the impacts of the bending work. It is, therefore, attracting attention as a compact and inexpensive thermal head of high performance. This thermal printing head, however, encounters the following problem during the course of its manufacture.

For example, during the course of the etching treatment to be performed for the formation of the heat-inhibiting film or the electrodes or of the ashing treatment to be performed on the masking film, the heat-resistant resin layer sustains an injury.

Then, during the deposition of a heat-generating resistor substance in the form of film under a vacuum, the polyimide resin layer is suffered to emit a gas abundantly. This gas brings about an adverse effect of rendering the control of the magnitude of resistance difficult. Further, during the distribution of wires by the wire bonding technique, the elasticity of the polyimide resin layer renders the work of bonding difficult.

As one measure for the solution of this problem, the present applicant for patent formerly proposed a thermal head having interposed between the heat-resistant resin layer and the heat-generating resistor layer a resin-protecting layer made of such an inorganic insulating substance as alumina, silicon oxynitride, or Sialon (Si-Al-ON) (Japanese Patent Application Disclosure SHO 63 (1988)-189,253, SHO 63(1988)-297,066, and Japanese Patent Application SHO 62(1987)-191,655). By the interposition of the resin-protecting layer between the heat-resistant resin layer and the heat-generating resistor layer in the manner described above, the polyimide resin layer is prevented from sustaining an injury and the polyimide resin layer from emitting gas during the manufacture of the thermal printing head and the thermal printing head is allowed to acquire certain improvement in rigidity. Thus, the produced thermal printing head has an effect of enabling the actual work of mounting to be carried out stably.

This superposition of the resin-protecting layer on the heat-resistant resin layer constitutes itself an effective measure for enabling the actual work of mounting to be stably performed because this resin-protecting layer serves not merely as a high-resistance base plate for a thermal head but also as an insulating substrate for other electronic devices.

Japanese Patent Application Disclosure SHO 61(1986)-297,159 discloses a thermal printing head which comprises a ceramic substrate, a glazed glass layer covering the ceramic substrate, a layer of a compound, i.e. silicon nitride doped with a stated amount of oxygen, superposed on the glazed glass layer, and a heat-generating resistor layer further superposed on the doped compound layer. This compound layer precludes diffusion of a defiling substance from the glazed glass layer to the heat-generating resistor layer and protects the glazed glass layer against fusion.

Japanese Patent Application Disclosure SHO 62(1987)-117,760 discloses a thermal printing head comprising a glazed glass layer, a polyimide resin layer formed on the glazed glass layer, and an adhesive layer of such an inorganic substance as NiCr, Cr, or Ti and an insulating layer formed of $SiO_2$, $Si-O-N_4$, or $Al_2O_3$ both superposed on the polyimide resin layer to ensure adhesiveness to the polyimide resin layer and materialize an insulating heat-resistant layer. This construction permits a reduction in the power applied to the thermal printing head.

When the heat-resistant insulating substrate comprising a layer of such a heat-resistant resin as polyimide resin and a resin-protecting layer of such an inorganic insulating substance as alumina, silicon oxynitride, or Sialon (Si-Al-ON) superposed on the heat-resistant resin layer is used as a high-resistance base member for a thermal printing head, for example, there are derived various advantages. The inorganic insulator layer mentioned above, however, does not acquire any sufficient film strength but entails the following problem.

When the inventors actually manufactured a thermal printing head provided with the resin-protecting layer, set this thermal head in a printer, and put this printer to actual operation, they noticed an abnormal change in the magnitude of resistance and observed various signs of adverse effects on the printing. On elaborate examination of the printer operation in search of the cause for this abnormal change in the magnitude of resistance, the inventors found that foreign matter such as dust entrapped between the thermal head and the thermosensitive paper or between the thermosensitive paper and the roller inflicted a crack on the abrasion-resistant layer constituting the surface layer of the thermal printing head and the crack suffered to extend as far as the heat-generating resistor member manifested adverse effects on the printing characteristic.

This problem has never been observed with the thermal printing head which is similar in construction, excepting a high-resistance base member having a glazed glass layer superposed on the conventional ceramic substrate or a high-resistance base member having a glass layer superposed on a metallic substrate is used.

This phenomenon may be logically explained by a postulate that in the thermal printing head which uses the high-resistance base member incorporating therein a glazed glass layer or a glass layer as an insulating layer, the substrate in its entirety possesses high rigidity enough to be prevented from yielding to local deformation and sustaining the crack of the nature mentioned above because the abrasion-resistant layer, on exposure to local pressure, is only suffered to deform in the same pattern as the substrate.

In contrast, in the case of the high-resistance base member using such a heat-resistant resin as polyimide resin, although the resin-protecting layer enhances the rigidity of the substrate to a certain extent, the capacity of the layer of the resin for deformation is conspicuous as compared with the abrasion-resistant layer. When a locally concentrated load is exerted upon the abrasion-resistant layer, therefore, the deformation of the heat-resistant layer cannot be prevented by the resin-protecting layer and the abrasion-resistant layer. It is consequently though that the crack occurs when the deformation of the resin-protecting layer or the abrasion-resistant layer fails to follow the deformation of the heat-resistant resin layer.

The problem of this nature is not limited to the thermal printing head. Similarly in the case of the hybrid IC quality multilayer circuit board mentioned above, for example, the deformation sustained by the heat-resistant resin layer as during the course of actual mounting inflicts breakage of wire in the wire-distribution layer and eventually impairs the outcome of the bonding work.

OBJECT AND SUMMARY OF THE INVENTION

An object of this invention is to provide a heat-resistant insulating substrate possessing high rigidity.

Another object of this invention is to provide a heat-resistant insulating substrate adapted to repress the ratio of occurrence of defectives during the course of actual mounting.

A further object of this invention is to provide a thermal heat such that, when it is set in place in a printer, for example, the abrasion-resistant layer used therein absolutely no crack or only sparing crack.

Still another object of this invention is to provide a thermal printing head capable of producing a stable printing operation.

Yet another object of this invention is to provide a thermal printing head prevented from sustaining an injury in the heat-resistant resin layer thereof during the course of manufacture, enabled to effect easy control of the magnitude of resistance, and allowed to yield to stable wire bonding during the work of actual mounting.

A further object of this invention is to provide a thermal printing head enabled to acquire enhanced strength without requiring any increase in the thickness of the abrasion-resistant layer.

It is a further object of this invention to provide a thermographic apparatus capable of effecting a stable printing operation.

It is yet another object of this invention to provide thermographic apparatus capable of highly reliable operation.

The heat-resistant insulating substrate of the present invention is characterized by comprising at least a highly thermoconductive supporting substrate, a heat-resistant resin layer formed on the supporting substrate, and a resin-protecting layer superposed on the heat-resistant resin layer and formed of one layer, or a plurality of layers, of an amorphous substance containing at least one member from among hydrogen and halogen elements and using as main components thereof silicon and at least one member selected from among nitrogen, carbon, and oxygen.

The thermal printing head of the present invention comprises at least a highly thermoconductive supporting substrate, a heat-resistant resin layer formed on the supporting substrate, a resin-protecting layer deposited on the heat-resistant resin layer, a multiplicity of heat-generating resistor members formed on the resin-protecting layer, conductors connected to the heat-generating resistor members, and an abrasion-resistant layer disposed so as to cover at least the heat-generating parts of the heat-generating resistor members, which thermal printing head is characterized by the fact that at least either of the resin-protecting layer and the abrasion-resistant layer is formed on one layer, or a plurality of layers, of an amorphous substance containing at least one member from among hydrogen and halogen elements and using as main components thereof silicon and at least one member selected from among nitrogen, carbon, and oxygen.

The thermographic apparatus of this invention is characterized by comprising at least conveyor means for conveying a thermosensitive recording paper, the aforementioned thermal printing head of this invention for printing on the thermosensitive recording paper, driving elements for severally driving the heat-generating resistor members of the thermal printing head in accordance with recording signal data, and a data processing circuit for supplying recording signals to the driving elements.

The heat-resistant resin layer to be used in the heat-resistant insulating substrate, the thermal printing head, and the thermographic apparatus of this invention is desired to be formed of one layer, or a plurality of layers, of polyimide resin, polyamide resin, polyamideimide resin, or a mixture of the resins. Preferably it is made of the polyimide resin.

In the heat-resistant insulating substrate, the thermal head, and the thermographic apparatus of this invention, the resin-protecting layer or the abrasion-resistant layer or both which is formed of one layer, or a plurality of layers, of an amorphous substance containing at least one member from among hydrogen and halogen elements and using as main components thereof silicon and at least one member selected from among nitrogen, carbon, and oxygenis produced by any of the conventional methods such as, for example, spattering method, ion-plating method, vacuum deposition method, plasma CVD method, ECR plasma CVD method, thermal CVD method, and photo-CVD method. Among other methods enumerated above, the plasma CVD method proves to be particularly advantageous in respect that the produced film enjoys fast adhesiveness, the treatment can be carried out at a relatively low temperature without impairing the characteristics of the substrate, and the physical properties, i.e. electrical properties and optical properties, of the film can be controlled easily. Particularly in the present invention, since the substrate to be covered is formed of a heat-resistant resin, the temperature of the substrate is not allowed, even when polyimide resin is employed as the heat-resistant resin, to exceed 550 C, a temperature tolerated thermally by the polyimide resin in an ordinary run. Thus, the method employed for the production mentioned above must be capable of permitting the treatment to be carried out at a temperature lower than the tolerable temperature mentioned above.

The plasma CVD method which uses the raw material gases including $SiH_4$ gas and $SiF_4$ gas as Si components and $N_2$ gas, $CH_4$ gas, and $N_2O$ gas as other components forms a thin ceramic film aimed at on the substrate by converting the raw material gases into a plasma in a vacuum and allowing the plasma to deposit on the substrate. In this case, the film occludes such halogen elements as hydrogen and fluorine from the raw material gases. The produced thin film is capable of retaining its amorphous state stably owing to the effects of such occluded elements.

As the resin-protecting layer or the abrasion-resistant layer in the thermal printing head or as the resin-protecting layer in the heat-resistant insulating substrate respectively of the present invention, there is formed a layer of an amorphous substance containing at least one member from among hydrogen and halogen elements and using as main components thereof silicon and at least one member selected from among nitrogen, carbon, and oxygen.

Since this layer of amorphous substance contains hydrogen and halogen elements and abounds in transition, the layer as a film possesses high toughness. Since the layer is formed of an inorganic substance unlike polyimide, the substrate itself exhibits an appreciably high hardness.

As the result, the substrate as a whole or the thermal head as a whole possesses high rigidity and high crackproofness. Thus, it is enabled to preclude the crack which would otherwise be inflicted owing to local deformation of the heat-resistant layer of polyimide resin under the pressure exerted on the surface layer.

Incidentally, when the prevention of the heat-resistant resin layer in the thermal printing head from deformation is considered alone, it could be accomplished by increasing the thickness of the abrasion-resistant layer. Since this measure enlarges the distance between the heat-generating resistor and the thermosensitive paper, it not only entails serious drawbacks of quality such as impairment of efficiency and impairment of resolving power but also degrades the capacity for mass production in a large measure. In contrast, in the present invention, owing to the use of the amorphous substance of the nature described above, the substrate as a whole is allowed to acquire high strength without requiring any increase in the thickness of the layer.

As described above, the heat-resistant insulating substrate of this invention is enabled by the improvement of hardness of the resin-protecting layer to enhance the stability of the work of mounting and curb the ratio of occurrence of defects due to breakage of wire. When this heat-resistant insulating substrate is used as a high-resistance base plate in the thermal printing head, it goes to stabilizing the printing operation of the thermal printing head.

The thermal printing head of this invention prevents the heat-resistant resin layer from sustaining an injury during the course of manufacture thereof, facilitates the control of the magnitude of resistance, enables the operation of wire bonding to be carried out stably during the work of actual mounting, effectively prevents the abrasion-resistant layer as a surface layer from sustaining a crack during the actual printing operation, and therefore enables the printing to proceed stably and enjoys decided improvement in reliability of operation.

Owing to the use of the thermal printing head of this invention, the thermographic apparatus of this invention enjoys a remarkable improvement in the reliability of performance.

BRIEF DESCRIPTION OF THE DRAWINGS

FIG. 1 is a perspective view illustrating in a partially disassembled state a typical thermal printing head as one embodiment of this invention.

FIG. 2 is a flow chart of the process of production of the thermal printing head as one embodiment of this invention.

DETAILED DESCRIPTION OF PREFERRED EMBODIMENTS

Figure 3:
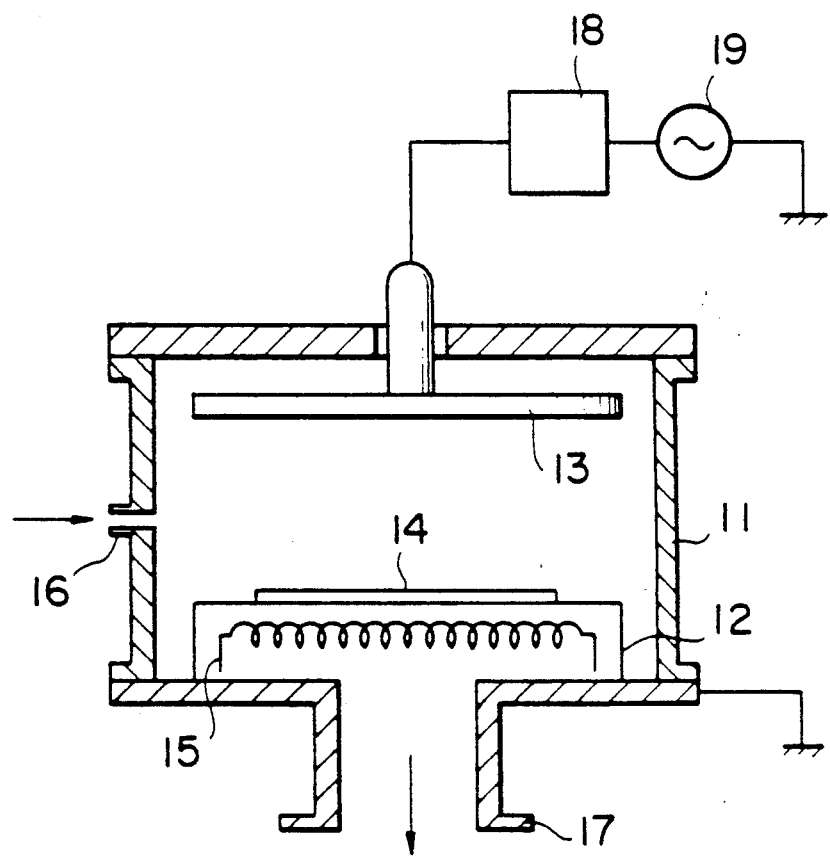
FIG. 3 is a diagram illustrating the construction of a plasma CVD device used in the formation of a layer of amorphous substance in a working example of this invention.

Now, a working example of this invention will be described below with reference to the accompanying drawings.

FIG. 1 is a structural diagram of the essential part of a typical thermal printing head as one embodiment of this invention. In the diagram, 1 stands for a metallic substrate made of a Fe-Cr alloy, for example, in a thickness of about 0.5 mm. On this metallic substrate 1, a heat-resistant resin layer 2 formed of one layer, or a plurality of layers, of polyimide resin or polyamideimide resin or a mixture thereof and destined to serve concurrently as a heat-accumulating layer and an insulating layer is superposed in a thickness of about 20 μm. On this heat-resistant resin layer 2, a resin-protecting layer 3 made of an amorphous substance using as main components thereof silicon and at least one member from among nitrogen, carbon, and oxygen and containing at least one member from among hydrogen and halogen elements is formed in a thickness in the range of 1 to 10 μm. The layers mentioned above jointly form a heat-resistant insulating substrate 4.

On the heat-resistant insulating substrate 4, a heat-generating resistor member 5 made of Ta-SiO$_2$, for example is formed. On the heat-generating resistor member 5, several electrodes 6 and a common electrode 7 formed of Al or Al-Si-Cu, for example, in a thickness approximately in the range of 0.7 to 1 μm in such a manner as to give rise to openings destined to serve as heat-generating parts 10 are superposed. Then, an adhesive layer 8 made of SiO$_2$ and an abrasion-resistant layer 9 made of Si-O-N and adapted to serve additionally as an antioxidant layer are formed so as to cover at least the openings intended to serve as heat-generating parts 10 are formed.

In this thermal printing head, when pulses of voltage spaced by pertinent time intervals are applied between the several electrodes 6 and the common electrode 7, the heat-generating resistor members corresponding to the openings destined to serve as heat-generating parts 10 generate heat to effect printing and recording. This thermal printing head is manufactured as follows, for example.

First as indicated in FIG. 2, the metallic substrate 1 of a Fe-Cr alloy having a Fe content of 16 wt % is cut in a prescribed size, degreased, washed, dried, and heat-treated at a temperature in the range of 600° C. to 800° C. in an atmosphere of dry hydrogen (FIG. 2-a).

Then, on this metallic substrate 1, polyimide varnish or polyamideimide varnish is spread with a roll coater or a spin coater in an amount calculated to form a film 20 to 30 μm in thickness after firing. The applied layer of the varnish is dried and fired to give rise to the heat-resistant resin layer 2 (FIG. 2-b).

Then, the surface of the heat-resistant resin layer 2 is washed (FIG. 2-c) and the resin-protecting layer 3 is superposed on the cleaned surface by the plasma CVD method (FIG. 2-d).

In the present embodiment, the heat-resistant insulating substrate 4 is completed by forming the resin-protecting layer 3, following the procedure described hereinbelow and using a parallel-plate capacitive coupling type plasma CVD device illustrated in FIG. 3.

In FIG. 3, 11 stands for a vacuum chamber. Inside this vacuum chamber 11, a plate grounded electrode 12 and a high-frequency electrode 13 are opposed to each other. On the plate grounded electrode 12, a treating substrate 14 or the metallic substrate 1 having the heat-resistant resin layer 2 formed thereon is mounted. Then, with a vacuum pump (not shown), the interior of the vacuum chamber 11 is evacuated to a level of about 10 Torrs. With a heater 15 attached to the grounded electrode 12, the treating substrate 14 is heated to a temperature approximately in the range of 150° C. to 450° C. The raw material gas is introduced through a gas inlet 16 into the vacuum chamber 11 and discharged through an outlet 17 in such a manner as to maintain the interior of the vacuum chamber 11 to a vacuum degree approximately in the range of 0.05 to 1.0 Torr and, at the same time, the electric power from a high-frequency power source 19 is advanced via a matching box 18 to the high-frequency electrode 13, with the result that glow discharge occurs between the electrodes to convert the raw material gas into a plasma and give rise to a thin film aimed at on the treating substrate 14.

Here, the typical conditions for the film formation are shown in Table 1.

As compared with the conventional spattering method which produces a SiO$_2$ film at a rate of 4,000 Å/hour, the plasma CVD method produces a film at a very high rate as shown in Table 1.

TABLE 1

| condition | Film | | | | | |
|---|---|---|---|---|---|---|
| | a*-SiO | a-SiN | a-SiC | a-SiCN | a-SiON | a-SiCO |
| Flow rate of raw material gas (SCCM) | SiH$_4$ 100<br>N$_2$O 500 | SiH$_4$ 50<br>N$_2$ 500 | SiH$_4$ 50<br>CH$_4$ 300 | SiH$_4$ 100<br>N$_2$ 300<br>CH$_4$ 100 | SiH$_4$ 50<br>N$_2$O 100<br>N$_2$ 500 | SiH$_4$ 50<br>CH$_4$ 300<br>N$_2$O 50 |
| Reaction pressure (Torr) | 1.0 | 1.0 | 1.0 | 1.0 | 1.0 | 1.0 |
| High-frequency power (W) | 300 | 500 | 500 | 500 | 500 | 500 |
| Film-forming time (minute) | 30 | 60 | 60 | 60 | 60 | 60 |
| Film thickness (μm) | 5.0 | 5.0 | 5.0 | 5.0 | 5.0 | 5.0 |

*amorphous

Since this plasma CVD method shortens the time of operation, it brings about an advantage of lowering the cost of production.

Then, on the resin-protecting layer 3 of the heat-resistant insulating substrate 4, a film of a heat-generating resistor substance such as Ta-SiO$_2$ or Ti-SiO$_2$ is deposited by the spattering method or other known method (FIG. 2-e) and a film of an electrode substance such as Al, Al-Si-Cu, or Au is formed by the spattering method (FIG. 2-f). Subsequently, a masking film is formed in a desired circuit pattern so as to give rise to openings destined to serve as heat-generating parts. Thereafter, several heat-generating resistor members 5, several electrodes 6, and a common electrode 7 are formed by a chemical dry etching treatment, for example (FIG. 2-g).

Thereafter, the thermal printing head is completed by forming an adhesive layer 8 of SiO$_2$ and an abrasion-resistant layer 9 of Si-O-N by the spattering method or other method (FIG. 2-h).

During the manufacture of a thermal printing head, the hardness of the resin-protecting layer and the hardness of the abrasion-resistant layer destined to serve as a surface layer were measured. The results were as follows.

First, on the heat-resistant resin layer 2, an a-SiN film, an a-SiC film, and an a-SiO film were severally superposed as the resin-protecting layer 3, each in varying thicknesses of 500 Å, 1 μm, 2 μm, 3 μm, and 5 μm by the procedure described above. The film thus formed were tested for Knoop hardness.

Figure 4:
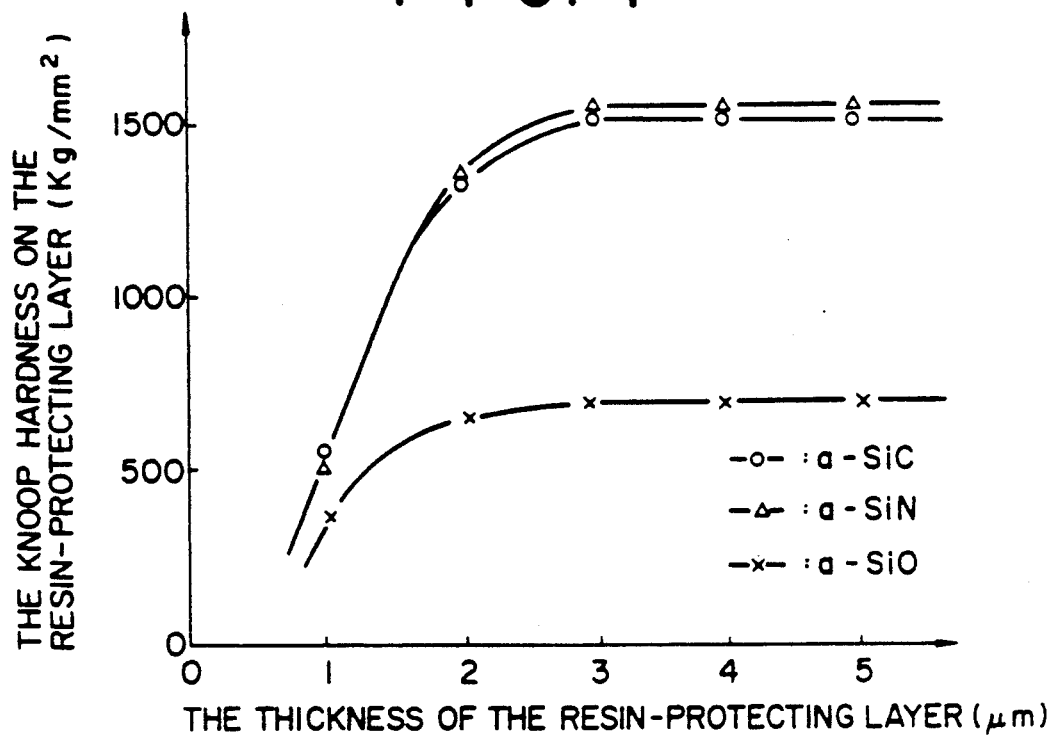
FIG. 4 is a graph showing the relation between the thickness of the resin-protecting layer and the Knoop hardness in the working example of this invention.

The results are shown in FIG. 4. It is clearly noted from the diagram that the a-SiO film, and a-SiC film exceeding 2 to 3 μm in thickness possessed a substantially fixed Knoop hardness. The films failed to reach this fixed hardness when they were less than 1 μm in thickness.

Then, on the heat-resistant insulating substrates provided with resin-protecting layers of the varying thickness, heat-generating resistor members, several electrodes, and common electrodes were formed by following the procedure described above and a $SiO_2$ film 1 μm in thickness as an adhesive layer and a Si-O-N film 2 μm in thickness as an abrasion-resistant layer were superposed thereon sequentially in the order mentioned. The thermal heads thus prepared were tested for Knoop hardness on the Si-O-N films.

Figure 5:
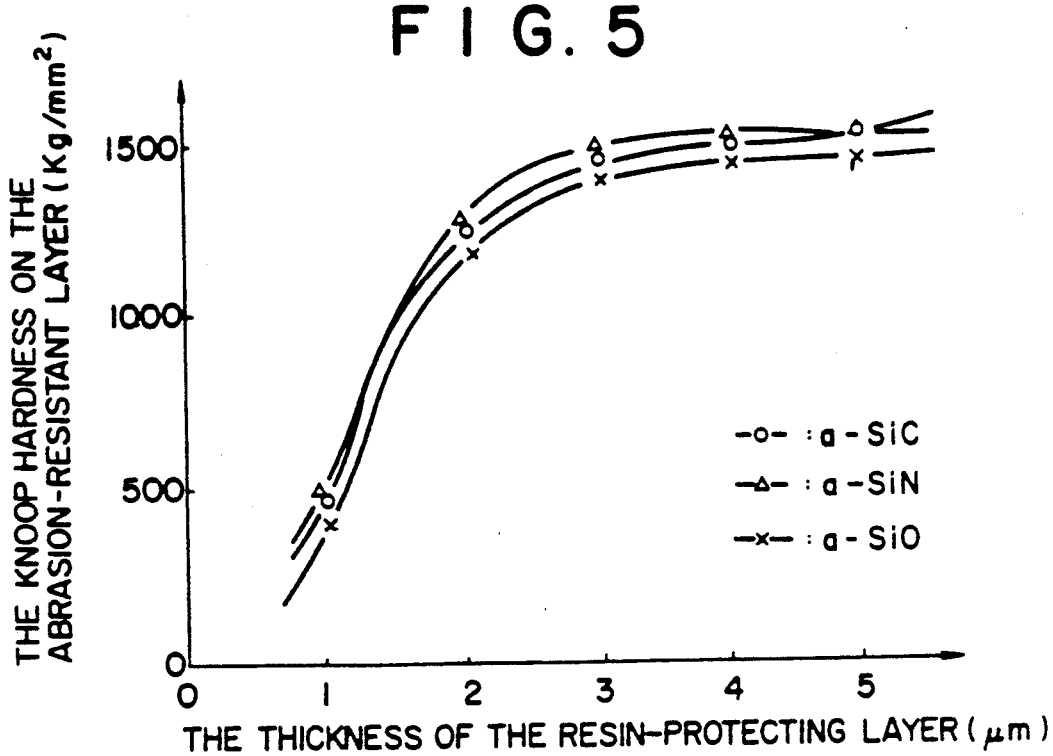
FIG. 5 is a graph showing the relation between the thickness of the resin-protecting layer and the knoop hardness thereof on the abrasion-resistant layer in the working example of this invention.

The results were as shown in FIG. 5. It is noted from the diagram that similarly to the resin-protecting layers mentioned above, these resin-protecting layers possessed a substantially fixed hardness when they were more than about 2 μm and they failed to reach this fixed hardness when they were less than 1 μm in thickness.

These results indicate that the effect of improving the film hardness is not sufficiently manifested when the thickness of the resin-protecting layer fails to reach 1 μm. If the film thickness is unduly large, the excess of thickness brings about no addition to the effect in the improvement of film hardness and rather dilutes the effect of heat accumulation manifested by the heat-resistant resin layer and impairs the efficiency. The thickness of the resin-protecting layer, therefore, is desired to be approximately in the range of 1 to 10 μm.

Then, the thermal printing heads provided severally with a-SiN films, and a-SiO films of the varying thickness mentioned above were mounted on radiating substrates of Al with a double-face adhesive tape and subjected to a wire-distribution test by the ultrasonic bonding with the driving IC's similarly mounted on driver substrates. Consequently, they were found to permit stable bonding.

The thermal printing heads obtained as described above were left standing for 1,000 hours in a constant temperature consant humidity bath at 60 C and 90% RH, they remained perfectly intact and sustained no crack.

These thermal printing heads were each set in a printer and put to trial printing operation. This printing was performed at normal room temperature under normal pressure. After a 5-km running test, the thermal printing head using an a-SiN film 500 Å in thickness as the resin-protecting layer sustained cracks at five places in the abrasion-resistant layer and the thermal heads using an a-SiC film and an a-SiO film each 500 Å in thickness as the resin-protecting layer sustained cracks at eight places, whereas the thermal printing heads using an a-SiN film, an a-SiC film, and an a-SiO film each 1 μm, 2 μm, 3 μm, and 5 μm in thickness were found to sustain virtually no discernible crack.

For comparsion, a thermal printing head identical in construction with the thermal printing head of the present embodiment was manufactured, excepting a Sialon layer 1 μm in thickness was formed by the spattering method as the resin-protecting layer. After a 5-km running test, this thermal printing head sustained cracks at 20 places in the abrasion-resistant layer.

It is clearly noted from the test results that the thermal printing head of the present embodiment were excellent in resistance to crack.

In the thermal printing head of the present embodiment, the a-SiN film, the a-SiC film, or the a-SiO film to be formed by the plasma CVD method as the resin-protecting layer between the heat-resistant resin layer and the heat-generating resistor prevents the heat-resistant resin layer from sustaining an injury when the electrode substance and the heat-generating resistor substance are melted and removed in a desired circuit pattern and also prevents the heat-generating resistor substance from emitting a gas during its formation in a vacuum. Thus, the thermal printing head permits stabilization of the magnitude of resistance.

Further, the wire bonding operation during the course of actual mounting of the thermal printing head can be carried out stably because the cushioning effect manifested by the heat-resistant resin layer can be offset by the hardness of the resin-protecting layer.

Besides the effects mentioned above, the a-SiN film, the a-SiC film, or the a-SiO film in the present embodiment possesses very high hardness as compared with the heat-resistant resin layer and is not required to have a very large thickness. Even when local pressure is exerted on the abrasion resistant layer during the actual printing operation, the resin-protecting layer prevents the heat-resistant resin layer from deformation. It, therefore, precludes local deformation and protects the abrasion-resistant layer against crack. As the result, the thermal head is enabled to continue its printing operation stably for a long time and enjoy very high reliability of operation.

The working examples have been described as ones using a-SiN film, a-SiC film, a-SiO film, a-SiCN film, a-SiON film, and a-SiCO film severally as the resin-protecting layer. Optionally, a plurality of these films may be jointly used in a superposed state as the resin-protecting layer to produce the same effect.

For example, the same effect was obtained when an a-SiN film or an a-SiO film advantageous in terms of film-forming speed was formed in a thickness of about 3 μm on the heat-resistant resin layer and an a-SiC film advantageous in terms of resistance to etching (chemical dry etching) was superposed in a thickness of about 0.3 μm. A laminated resin-protecting layer composed of an a-SiO film possessing a high film-forming speed as a first layer and an a-SiC film excelling in resistance to etching as a second layer proved to be advantageous from the practical point of view. To be specific, it permitted a decrease in the time required for the process of manufacture and excelled in productivity.

Incidentally, the a-SiC film forming the second layer comes into direct contact with the resistor film and, therefore, is required to possess an electrically insulating property. It fulfils its part safely so long as it exhibits specific resistivity of not less than $10^{11}$ Ωcm.

A laminated resin-protecting layer composed of the same a-SiN film and a-SiC film, excepting the qualities thereof were varied by changing the composition ratio of the component elements produced the same effect. For example, a two-layer laminate may be formed by superposing two a-SiC films differing in carbon concentration, with the film of lower carbon concentration disposed on the heat-resistant resin layer side to heighten the film-forming speed and the film of higher carbon concentration on the resistor film side to enhance the resistance to etching.

As regards the chemical composition of film, the hardness and the resistance to crack both are heightened in proportion as the total concentration of oxygen, nitrogen, and carbon contained in the films of a-SiO, a-SiN, a-SiC, a-SiON, a-SiOC, and a-SiNC is increased.

The laminated layer discharges its role safely so long as the total concentration exceeds 10 atomic percent. Where the resistance to etching is taken into consideration, the total concentration is desired to be not less than 20%.

In the preceding embodiment, the characteristics of the heat-resistant insulating substrate have been evaluated with respect to the performance as a thermal printing head. The thermal head is not the only embodiment of the heat-resistant insulating substrate contemplated by the present invention. The substrate of this invention may be embodied in a hybrid IC quality multilayer circuit board, for example. In this circuit board, the stability of the work of mounting can be ensured and the occurrence of defects due to fracture of the wire distribution layer can be effectively prevented by the ability of the resin-protecting layer to enhance hardness. Thus, the heat-resistant insulating substrate manifests its numerous effects to great advantage.

Now, a thermal printing head using an a-SiN film, an a-SiC film, or an a-SiO film, for example, as an abrasion-resistant layer will be described below as another embodiment of the heat-resistant insulating substrate.

First, polyimide resin was deposited as a heat-resistant resin layer on the metallic substrate prepared as described in the preceding embodiment and $SiO_2$ was superposed by the spatting method in a thickness of 1 $\mu m$ as a resin-protecting layer on the heat-resistant resin layer, to complete a heat-resistant insulating substrate.

Then, on this heat-resistant insulating substrate, heat-generating resistor members, several electrodes, and a common electrode were formed by following the same procedure, and an a-SiN film, an a-SiC film, or an a-SiO film was formed thereon by the plasma CVD method as an abrasion-resistant layer, to complete a thermal printing head. The abrasion-resistant layer was given a varying thickness of 2 $\mu m$, 3 $\mu m$, 5 $\mu m$, and 8 $\mu m$.

For comparison with the thermal printing head of the present embodiment, a thermal printing head provided with an abrasion-resistant layer of $Ta_2O_5$ deposited by the spattering method and a thermal printing head provided with an abrasion-resistant layer of Si-O-N deposited by the spattering method using a target composed of $Si_3N_4$ and 25% by weight of $SiO_2$ were prepared.

The thermal printing heads were each set in place in a printer and put to 5-km printing test. During the test, count was taken of the number of cracks sustained in the abrasion-resistant layers of the thermal printing head. The results are shown in Table 2.

TABLE 2

| Material for abrasion-resistant layer | | The Number of cracks sustained by abrasion-resistant layer | | | |
|---|---|---|---|---|---|
| | | 2 $\mu m$ | 3 $\mu m$ | 5 $\mu m$ | 8 $\mu m$ |
| Example of this invention | a-SiN film | 2 | 0 | 0 | 0 |
| | a-SiC film | 1 | 0 | 0 | 0 |
| | a-SiO film | 5 | 1 | 0 | 0 |
| Comparative Experiment | $Ta_2O_5$ film | 71 | 25 | 2 | 0 |
| | SiO—N film | 89 | 31 | 3 | 0 |

It is clearly noted from Table 2 that the a-SiN film, the a-SiC film, and the a-SiO film of the example formed by the plasma CVD method showed highly desirable resistance to crack as compared with the $Ta_2O_5$ film and the Si-O-N film of the comparative experiments having the same thickness. Similarly desirable effects were obtained with respect to the a-SiCN film, the a-SiON film, and the a-SiCO film, though not shown in Table 2.

From the results of the present embodiment, it is noted that the abrasion-resistant layer is desired to have a thickness of not less than 3 $\mu m$. When the resin-protecting layer is given still higher hardness, for example, the abrasion-resistant layer having a thickness of about 2 $\mu m$ fulfils its role satisfactorily.

If the thickness of the abrasion-resistant layer is unduly large, the efficiency of the thermal printing head is impaired. The thickness, therefore, is desired not to exceed 8 $\mu m$.

It is clear from the embodiment described above that the a-SiN film, the a-SiC film, the a-SiO film, the a-SiCN film, the a-SiON film, or the a-SiCO film formed by the plasma CVD method and used as an abrasion-resistant layer is prevented from sustaining a crack during the actual printing operation. The thermal printing head using this abrasion-resistant layer, therefore, enjoys high quality.

Further, since the film obtained by the plasma CVD method contains hydrogen and halogen elements and abounds with transitions, it excels the conventional $Ta_2O_5$ film and Si-O-N film in terms of toughness. The film to be used as an abrasion-resistant layer in a thermal printing head, therefore, is excellent is resistance to crack.

The embodiments so far described have been depicted as using in either of the resin-protecting layer and the abrasion-resistant layer of the thermal printing head a layer of an amorphous substance using as main components thereof silicon and at least one from among nitrogen, carbon, and oxygen. It is natural that the thermal printing head should manifest the same effect when the film of the amorphous substance is used in each of the two layers mentioned above. In this case, it is permissible to decrease the thickness of each of the two layers, based on the information given above with respect to the magnitude of film thickness.

Each of the embodiments described above has been depicted as having a heat-resistant resin layer formed on a metallic substrate. The material of the supporting substrate is not limited to metal. The effect of the present invention can be expected to be similarly obtained even when the material is a ceramic substance or glass. When the metallic substrate is employed as a supporting substrate, however, it contributes in a large measure to miniaturization of the thermal printing head because the metallic substrate itself can be used as a common electrode and also because it can be bent at will.

The resin-protecting layer of this invention may be formed by the spattering method using a target composed of silicon and at least one member from among nitrogen, oxygen, and carbon in an atmosphere of gas containing hydrogen or a halogen element.

Now, one embodiment of the thermal printing head of this invention in a facsimile, i.e. one form of the thermographic apparatus will be described below. The description will be given below, with emphasis on the printing part of the facsimile.

Figure 6:
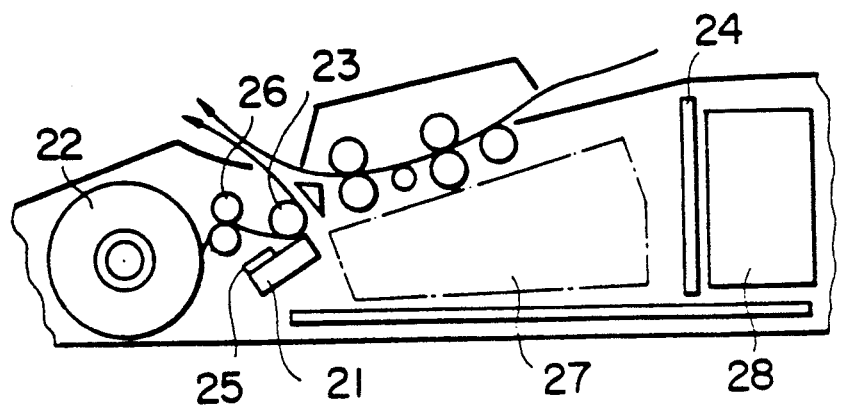
FIG. 6 is a model diagram illustrating in a cross section the thermographic apparatus of this invention.

FIG. 6 is a model diagram of the facsimile as one embodiment of the present invention.

A thermosensitive recording paper 22 is conveyed by a platen roller 23 and a pair of driving rollers 26 and, at the same time, the platen roller 23 is urged toward the thermal printing head 21 side to hold down the thermosensitive recording paper 22. The printing is accomplished by causing a recording signal forwarded from a data processing circuit 24 to a thermal printing head 21 to be processed with a driving element 25 installed on the thermal printing head 21, feeding electric pulses to dots necessary for the printing thereby heating the dots and consequently inducing discoloration of the corresponding parts of the thermosensitive recording paper 22.

An optical part 27 is a device for reading letters and figures on a given paper desired to be transmitted with an optical device and converting them into electric signals. A power source part 28 is a device for supplying electric power to set the component parts of the facsimile into operation.

In the facsimile described above, since the thermal head has a heat-resistant resin layer formed on a metallic substrate, it possesses thermal efficiency about 1.8 times as high as that of the conventional thermal printing head and warrants a generous saving in power consumption. The electric energy which the thermal printing head requires in producing prints of a fixed density is about 40% lower than that required by the conventional thermal printing head.

Since this facsimile uses the thermal printing head of this invention which sustains no crack or sustains cracks only slightly, it enjoys high reliability of performance.

What is claimed is:

1. A thermal printing head, having crackproofness against local pressure caused by entrapping foreign matter, comprising, a highly thermoconductive supporting substrate, a heat-resistant resin layer formed on the supporting substrate, a resin-protecting layer formed on the heat resistant resin layer, a plurality of heat-generating resistor members formed on the resin-protecting layer, conductors connected to the heat-generating resistor members, and an abrasion-resistant layer covering at least a heat-generating portion of the heat-generating resistor members, the abrasion-resistant layer being formed of at least one amorphous layer selected from the group of a-SiO layer, a-SiN layer and a-SiC layer, and the amorphous layer further containing at least one element selected from the group consisting of hydrogen and halogen, said abrasion-resistant layer having a thickness of 2 to 8 μm.

2. A thermal printing head according to claim 1, wherein the abrasion-resistant layer is formed by plasma CVD in which gases are converted into a plasma and deposited as a thin film on at least corresponding portions of the heat-generating resistor members by glow discharge.

3. A thermal printing head according to claim 1 or 2, wherein the heat-resistant resin layer is a resin layer including polyimide or polyamideimide as a main component.

4. A thermographic recording apparatus comprising a thermosensitive recording paper, conveyor means for conveying the thermosensitive recording paper, a thermal printing head for producing prints on the thermosensitive recording paper, the thermal printing head including a highly thermoconductive supporting substrate, a heat-resistant resin layer formed on the supporting substrate, a resin-protecting layer formed on the heat-resistant resin layer, a plurality of heat-generating resistor members formed on the resin-protecting layer, conductors connected to the heat-generating resistor members, and an abrasion-resistant layer covering at least heat-generating parts of the heat-generating resistor members, the abrasion-resistant layer being formed of at least one amorphous layer selected from the group of a-SiO layer, a-SiN layer and a-SiC layer, and the amorphous layer further containing at least one element selected from the group consisting of hydrogen and halogen, driving means for driving the heat-generating resistor members in accordance with recording signals, and data processing means for supplying the recording signals to the driving means, said abrasion-resistant layer having a thickness of 2 to 8 μm.

5. A thermographic recording apparatus according to claim 4, wherein the abrasion-resistant layer is formed by plasma CVD in which gases are converted into a plasma and deposited as a thin film on at least the heat-generating parts of the heat-generating resistor members by glow discharge.

6. A thermographic recording apparatus according to claim 4 or 5, wherein the heat-resistant resin layer includes polyimide or polyamideimide as a main component.

* * * * *